US011295931B2

(12) United States Patent
Sinclair

(10) Patent No.: US 11,295,931 B2
(45) Date of Patent: *Apr. 5, 2022

(54) APPARATUS AND TECHNIQUES FOR GENERATING BUNCHED ION BEAM

(71) Applicant: Varian Semiconductor Equipment Associates, Inc., Gloucester, MA (US)

(72) Inventor: Frank Sinclair, Boston, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/928,895

(22) Filed: Jul. 14, 2020

(65) Prior Publication Data

US 2020/0357603 A1   Nov. 12, 2020

Related U.S. Application Data

(63) Continuation-in-part of application No. 16/842,464, filed on Apr. 7, 2020, now Pat. No. 10,867,773,
(Continued)

(51) Int. Cl.
*H01J 37/20* (2006.01)
*H01J 37/317* (2006.01)
*H01J 37/30* (2006.01)

(52) U.S. Cl.
CPC .......... *H01J 37/3171* (2013.01); *H01J 37/20* (2013.01); *H01J 37/3007* (2013.01)

(58) Field of Classification Search
CPC ..... H01J 37/3171; H01J 37/3007; H01J 37/20
(Continued)

(56) References Cited

U.S. PATENT DOCUMENTS 6,281,512 B1    8/2001  Choi
6,423,976 B1 *  7/2002  Glavish ............... H01J 37/3171
                                                    250/492.21
(Continued)

FOREIGN PATENT DOCUMENTS

JP    H09237700 A    9/1997
JP    2015046337 A   3/2015
WO    2011105855 A2  9/2011

OTHER PUBLICATIONS

International Search Report and Written Opinion dated Dec. 2, 2019 for PCT/US2019/046274 filed Aug. 13, 2019.
(Continued)

*Primary Examiner* — Michael Maskell
(74) *Attorney, Agent, or Firm* — Kacvinsky Daisak Bluni PLLC

(57) ABSTRACT

An ion implantation system, including an ion source, and a buncher to receive a continuous ion beam from the ion source, and output a bunched ion beam. The buncher may include a drift tube assembly, having an alternating sequence of grounded drift tubes and AC drift tubes. The drift tube assembly may include a first grounded drift tube, arranged to accept a continuous ion beam, at least two AC drift tubes downstream to the first grounded drift tube, a second grounded drift tube, downstream to the at least two AC drift tubes. The ion implantation system may include an AC voltage assembly, coupled to the at least two AC drift tubes, and comprising at least two AC voltage sources, separately coupled to the at least two AC drift tubes. The ion implantation system may include a linear accelerator, comprising a plurality of acceleration stages, disposed downstream of the buncher.

13 Claims, 10 Drawing Sheets

Related U.S. Application Data which is a continuation of application No. 16/107,151, filed on Aug. 21, 2018, now Pat. No. 10,651,011.

(58) Field of Classification Search
USPC ............... 250/396 R, 281, 282, 492.1–492.3
See application file for complete search history.

(56) References Cited

U.S. PATENT DOCUMENTS

| | | | |
|---|---|---|---|
| 6,903,349 B2* | 6/2005 | Mitchell | H01J 37/3171 250/396 R |
| 10,192,727 B2* | 1/2019 | Sinclair | H01J 37/05 |
| 10,867,773 B2* | 12/2020 | Sinclair | H01J 37/20 |
| 2002/0084427 A1* | 7/2002 | Saadatmand | H05H 9/00 250/492.1 |
| 2004/0202272 A1* | 10/2004 | Yao | H05H 15/00 376/120 |
| 2005/0134204 A1 | 6/2005 | Bechthold et al. | |

OTHER PUBLICATIONS

Alt, et al., "Preparatory Investigations for a Low Frequency Prebuncher at REA," Proceedings of IPAC2014, Dresden, Germany, THPME051, 3342-3345, ISBN 978-3-95450-132-8.

Syphers, Mike, "Particle Accelerators and Beam Optics," Conference Proceedings, Day 2, Northern Illinois University, Fermi National Accelerator Laboratory, Jul. 2017.

* cited by examiner

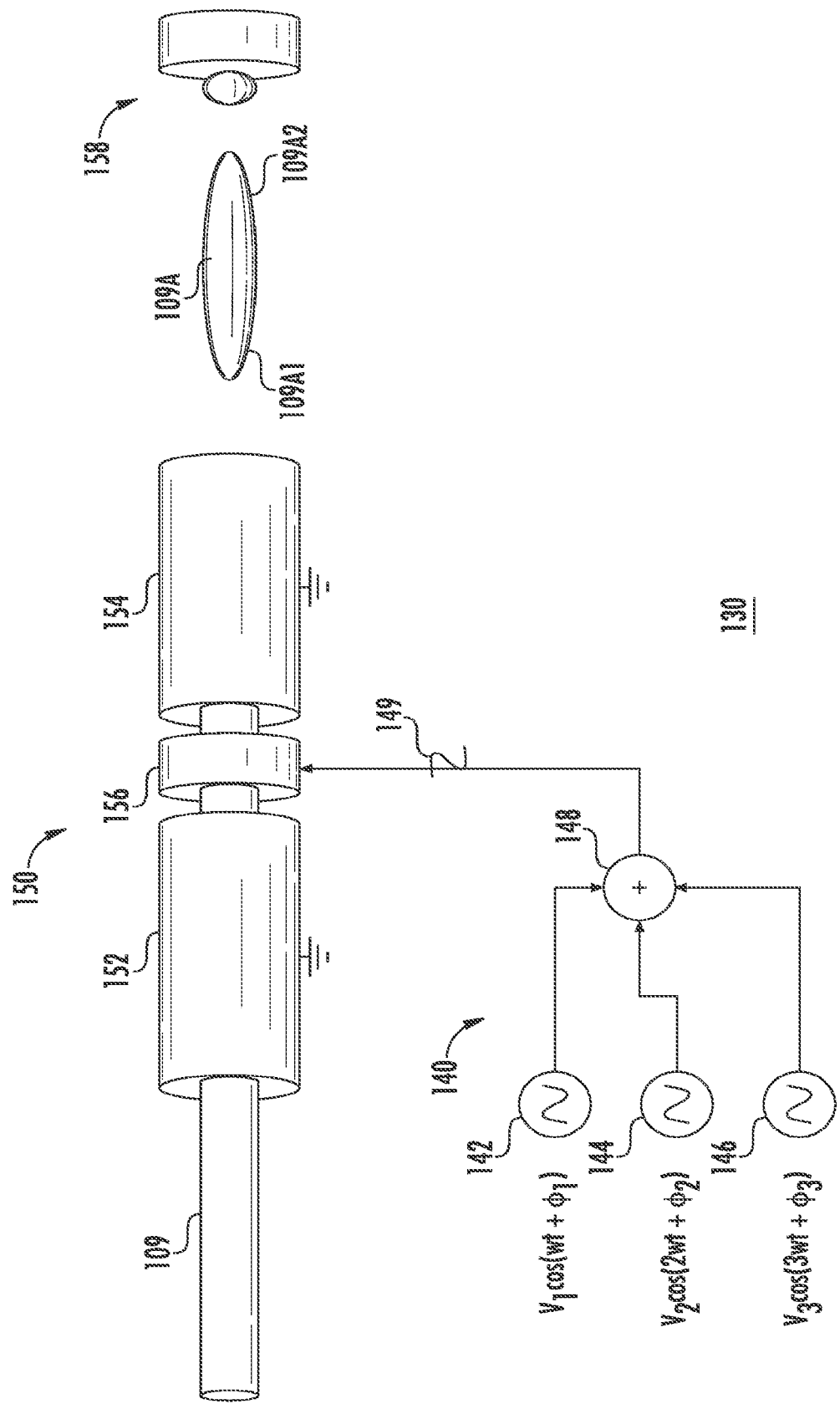

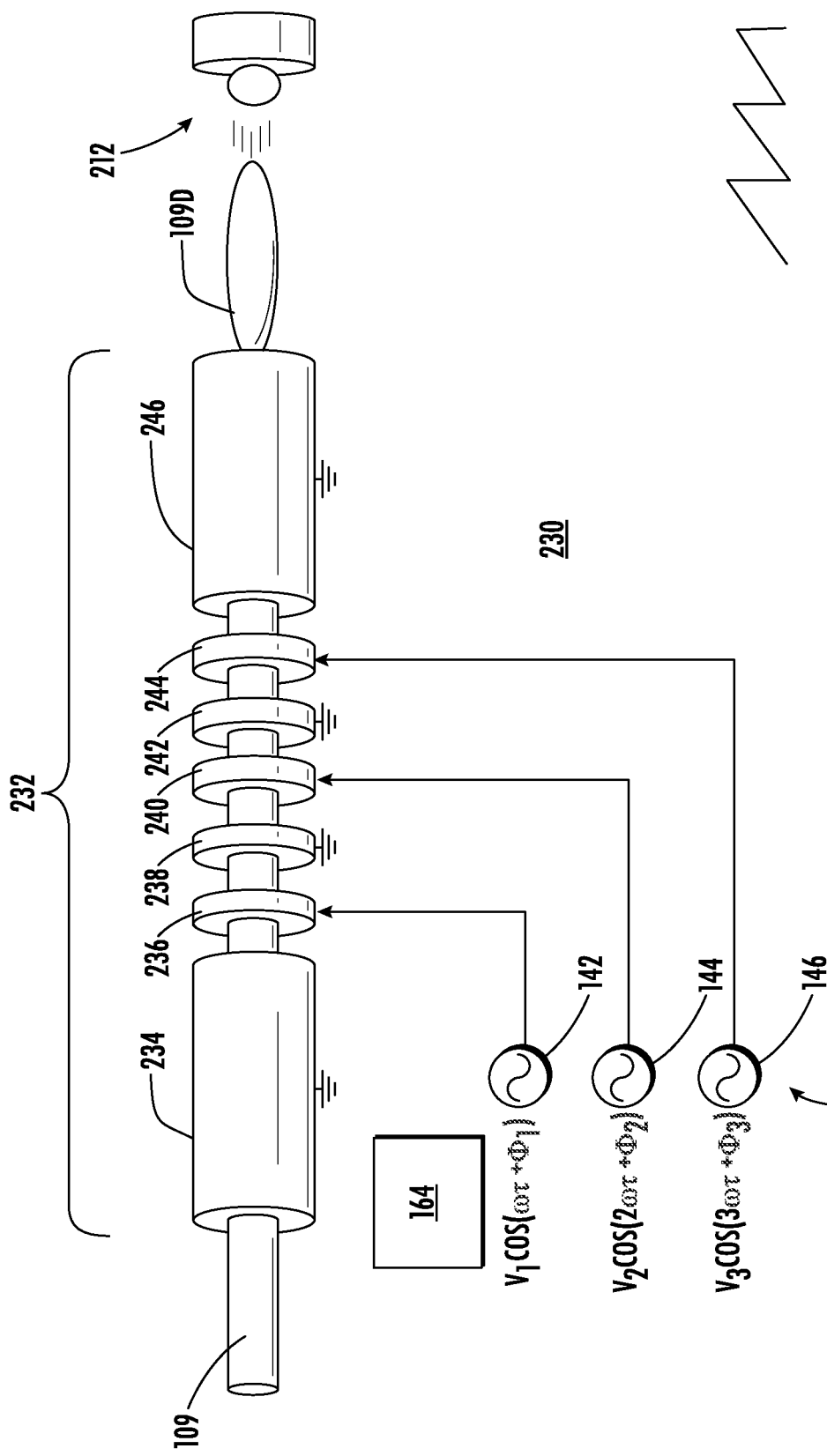

APPARATUS AND TECHNIQUES FOR GENERATING BUNCHED ION BEAM

RELATED APPLICATIONS

This application is a continuation-in-part of and claims priority to U.S. patent application Ser. No. 16/842,464, filed Apr. 7, 2020, entitled NOVEL APPARATUS AND TECHNIQUES FOR GENERATING BUNCHED ION BEAM, which application is a continuation of and claims priority to U.S. patent application Ser. No. 16/107,151, filed Aug. 21, 2018, entitled NOVEL APPARATUS AND TECHNIQUES FOR GENERATING BUNCHED ION BEAM, which applications are incorporated by reference herein in their entirety.

FIELD OF THE DISCLOSURE

The disclosure relates generally to ion implantation apparatus and more particularly to high energy beamline ion implanters.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. The beam-line components, may include, for example, a mass analyzer, a collimator, and various components to accelerate or decelerate the ion beam. Much like a series of optical lenses for manipulating a light beam, the beam-line components can filter, focus, and manipulate an ion beam having particular species, shape, energy, and/or other qualities. The ion beam passes through the beam-line components and may be directed toward a substrate mounted on a platen or clamp.

One type of ion implanter suitable for generating ion beams of medium energy and high energy uses a linear accelerator, or LINAC, where a series of electrodes arranged as tubes around the beam accelerate the ion beam to increasingly higher energy along the succession of tubes. The various electrodes may be arranged in a series of stages where a given electrode in a given stage receives an AC voltage signal to accelerate the ion beam.

LINACs employ initial stages that bunch an ion beam as the beam is conducted through the beamline. An initial stage of a LINAC may be referred to as a buncher, where a continuous ion beam is received by the buncher and is output as a bunched ion beam in packets. Depending upon the frequency of the AC voltage signal and the amplitude, the acceptance or phase capture of an ion beam conducted through a known "double-gap" buncher using one powered electrode may be on the order of 30-35%, meaning that 65% of more of beam current is lost while being conducted into the acceleration stages of the linear accelerator.

With respect to these and other considerations, the present disclosure is provided.

BRIEF SUMMARY

In one embodiment, an apparatus may include a multi-ring drift tube assembly, including an alternating sequence of a set of grounded drift tubes and a set of AC drift tubes, arranged in alternating fashion with one another. The multi-ring drift tube assembly may further include a first grounded drift tube, arranged to accept a continuous ion beam, at least two AC drift tubes, arranged in series, downstream to the first grounded drift tube, and a second grounded drift tube, downstream to the at least two AC drift tubes. The apparatus may further include an AC voltage assembly, electrically coupled to the at least two AC drift tubes. The AC voltage assembly may include a first AC voltage source, coupled to deliver a first AC voltage signal at a first frequency to a first AC drift tube of at least two AC drift tubes; and a second AC voltage source, coupled to deliver a second AC voltage signal at a second frequency to a second AC drift tube of the at least two AC drift tubes. As such the second frequency may constitute an integral multiple of the first frequency.

In a further embodiment, an ion implantation system may include an ion source to generate a continuous ion beam, and a buncher, disposed downstream of the ion source, to receive the continuous ion beam and output a bunched ion beam. The buncher may include a drift tube assembly, characterized by an alternating sequence of a set of grounded drift tubes and a set of AC drift tubes, arranged in alternating fashion with one another. The drift tube assembly may include a first grounded drift tube, arranged to accept a continuous ion beam, at least two AC drift tubes downstream to the first grounded drift tube; a second grounded drift tube, downstream to the at least two AC drift tubes, and an AC voltage assembly, electrically coupled to the at least two AC drift tubes. The AC voltage assembly may include at least two AC voltage sources, separately coupled to the at least two AC drift tubes. The ion implantation system may further include a linear accelerator, comprising a plurality of acceleration stages, disposed downstream of the buncher.

In another embodiment, an apparatus may include a multi-ring drift tube assembly and an AC voltage assembly. The multiring drift tube assembly may include a first grounded drift tube, arranged to accept a continuous ion beam and a first AC drift tube, disposed adjacent to the first grounded drift tube, and downstream of the first grounded drift tube. The multiring drift tube assembly may also include an intermediate grounded drift tube, arranged downstream of the first AC drift tube and downstream of the first AC drift tube, and a second AC drift tube, disposed adjacent to the intermediate grounded drift tube, and downstream of the intermediate grounded drift tube. The multiring drift tube assembly may also include a second grounded drift tube, wherein the second grounded drift tube is disposed adjacent to the second AC drift tube, and downstream of the second AC drift tube. The apparatus may further include an AC voltage assembly, electrically coupled to the multi-ring drift tube assembly. The AC voltage assembly may include a first AC voltage source, coupled to deliver a first AC voltage signal at a first frequency to the first AC drift tube, and a second AC voltage source, coupled to deliver a second AC voltage signal at a second frequency to the second AC drift tube, wherein the second frequency comprises an integral multiple of the first frequency.

BRIEF DESCRIPTION OF THE DRAWINGS

FIG. 2 shows an exemplary buncher, according to embodiments of the disclosure;

FIG. 9 shows yet another exemplary buncher, according to other embodiments of the disclosure.

FIG. 10 shows a sawtooth waveform.

Figure 1A:
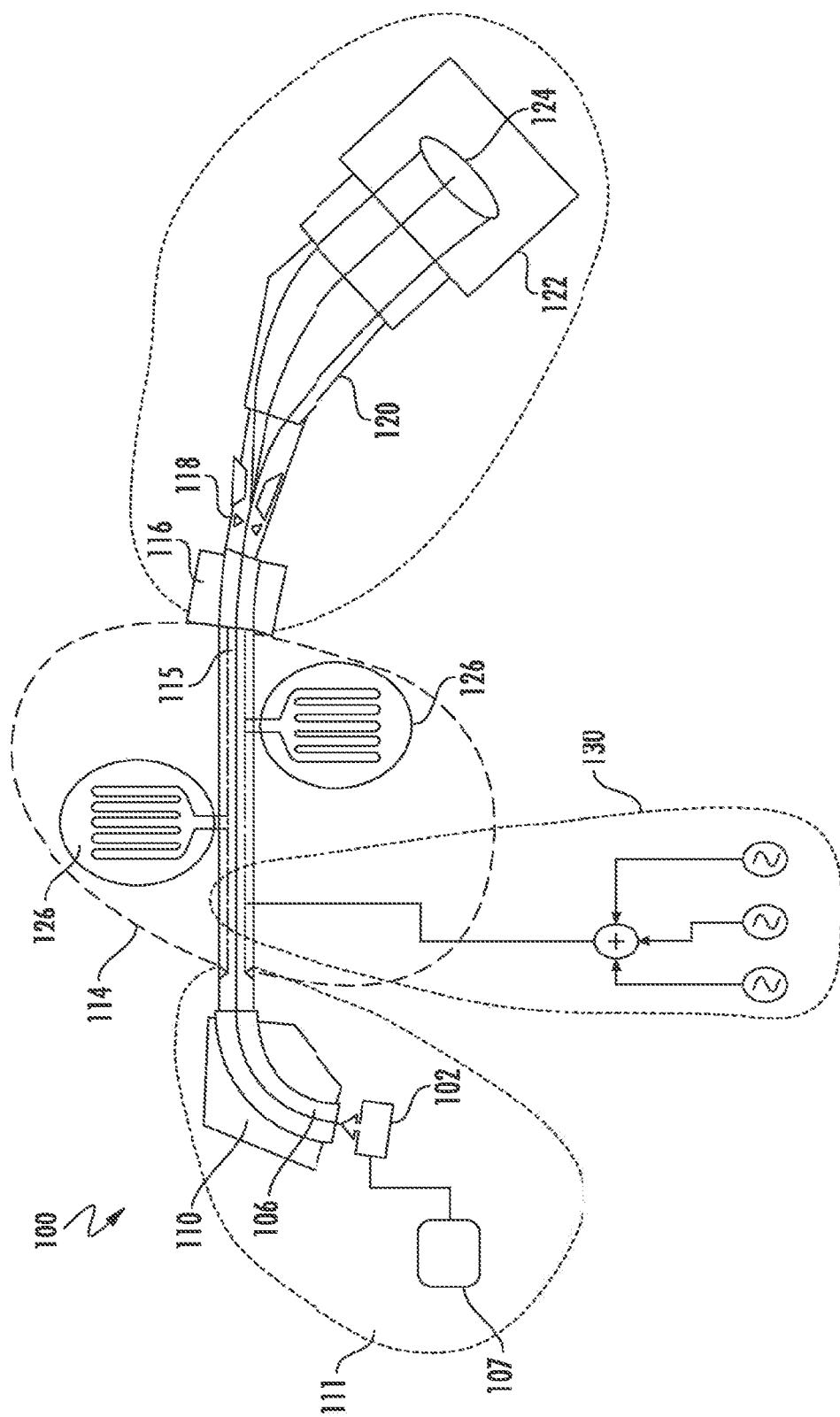
FIG. 1A shows an exemplary ion implantation system, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved high energy ion implantation systems, based upon a beamline architecture. For brevity, an ion implantation system may also be referred to herein as an "ion implanter." Various embodiments provide novel configurations for providing the capability of generating high energy ions, where the final ion energy delivered to a substrate may be 300 keV, 500 keV, 1 MeV or greater. In exemplary embodiments, a novel buncher design may be employed to process an ion beam in a manner that increases the acceptance of the ion beam, as described below.

Referring now to FIG. 1A, an exemplary ion implanter, shown as implantation system 100, is depicted in block form. The ion implantation system 100 may represent a beamline ion implanter, with some elements omitted for clarity of explanation. The ion implantation system 100 may include an ion source 102, and a gas box 107 held at high voltage as known in the art. The ion source 102 may include extraction components and filters (not shown) to generate an ion beam 106 at a first energy. Examples of suitable ion energy for the first ion energy range from 5 keV to 100 keV, while the embodiments are not limited in this context. To form a high energy ion beam, the ion implantation system 100 includes various additional components for accelerating the ion beam 106.

The ion implantation system 100 may include an analyzer 110, functioning to analyze a received ion beam. Thus, in some embodiments, the analyzer 110 may receive the ion beam 106 with an energy imparted by extraction optics located at the ion source 102, where the ion energy is in the range of 100 keV or below, and in particular, 80 keV or below. In other embodiments, the analyzer 110 may receive the ion beam accelerated by a DC accelerator column to higher energies such as 200 keV, 250 keV, 300 keV, 400 keV, or 500 keV. The embodiments are not limited in this context. The ion implantation system 100 may also include a buncher 130, and a linear accelerator 114 (shown in the dashed line), disposed downstream of the buncher 130. The operation of buncher 130 is detailed below. In brief, the buncher 130 is disposed downstream of the upstream beamline 111, to accept the ion beam 106 as a continuous ion beam (or DC ion beam), and to output the beam as a bunched ion beam. In a bunched ion beam the ion beam is output in discrete packets. At the same time, the energy of the ion beam may be increased by the buncher 130. The linear accelerator 114 may include a plurality of accelerator stages 126, arranged in series, as shown. The accelerator stages 126 may act similarly to the buncher, to output bunched ion beams at a given stage, and to accelerate the ion beam to a higher energy in stages. Thus, a buncher may be considered to be a first accelerator stage, differing from downstream accelerator stages in that the ion beam is received as a continuous ion beam.

In various embodiments, the ion implantation system 100 may include additional components, such as a filter magnet 116, a scanner 118 and collimator 120, where the general functions of the filter magnet 116, scanner 118 and collimator 120 are well known and will not be described herein in further detail. As such, a high energy ion beam, represented by the high energy ion beam 115, after acceleration by the linear accelerator 114, may be delivered to an end station 122 for processing of a substrate 124.

In some embodiments, where the ion beam 106 is provided directly to the analyzer 110, the buncher 130 may receive the ion beam 106 as a continuous ion beam at a relatively lower energy, such as less than 100 keV, as noted. In other embodiments, where the ion implantation system includes a DC accelerator column, the ion beam 106 may be accelerated to be fed as a continuous ion beam at energies of up to 500 keV or greater. In these different cases the exact alternating current (AC) voltages applied by the buncher 130 may be adjusted according to the ion energy of the continuous ion beam received by the buncher 130.

Figure 1B:
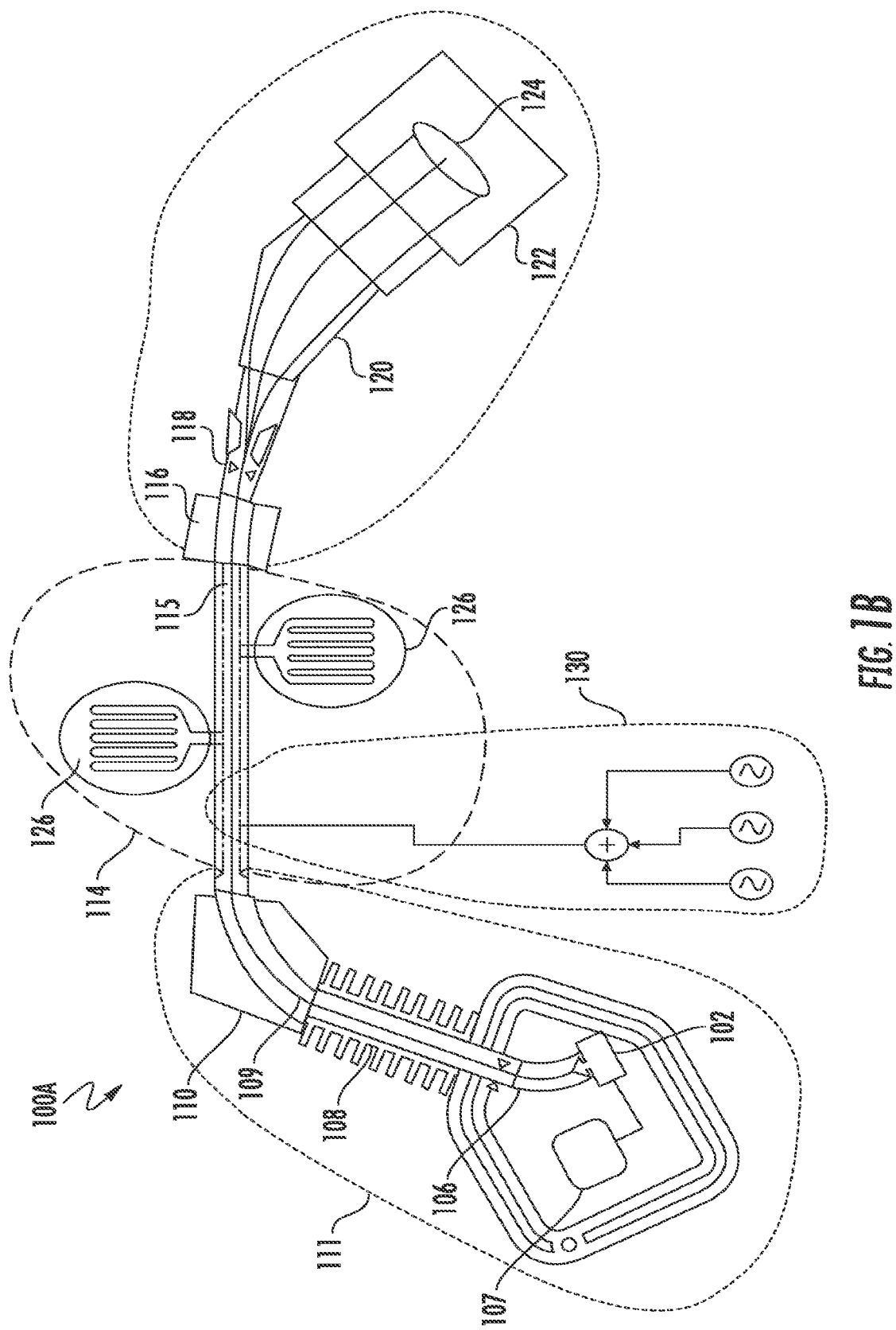
FIG. 1B shows another ion implantation system, according to embodiments of the disclosure.

FIG. 1B shows an embodiment of an ion implantation system 100 A, including a DC accelerator column 108, disposed downstream of the ion source 102, and arranged to accelerate the ion beam 106 to produce an accelerated ion beam 109 at a second ion energy, where the second ion energy is greater than the first ion energy, generated by the ion source 102. The DC accelerator column 108 may be arranged as in known DC accelerator columns, such as those columns used in medium energy ion implanters. The DC accelerator column may accelerate the ion beam 106, wherein the accelerated ion beam 109 is received by the analyzer 110 and buncher 130 at an energy such as 200 keV, 250 keV, 300 keV, 400 keV, or 500 keV. Otherwise, the ion implantation system 100A may function similarly to ion implantation system 100.

FIG. 2 shows the structure of an exemplary buncher of a linear accelerator, shown as buncher 130, according to embodiments of the disclosure. The buncher 130 may include a drift tube assembly 150, including a first grounded drift tube 152, arranged to accept a continuous ion beam, shown as accelerated ion beam 109. As shown, the first grounded drift tube 152 is connected to electrical ground. The drift tube assembly 150 may further include an AC drift tube assembly, arranged downstream to the first grounded drift tube 152. As discussed in detail below, the AC drift tube assembly 156 is arranged to receive an AC voltage signal, generally in the radio frequency range (RF range), which signal functions to accelerate and manipulate the accelerated ion beam 109. In the embodiment of FIG. 2, the AC drift tube assembly 156 includes just one AC drift tube. In other embodiments, an AC drift tube assembly 156 may include multiple AC drift tubes.

The drift tube assembly 150 further includes a second grounded drift tube 154, downstream to the AC drift tube assembly 156. As a whole, the drift tube assembly 150 is arranged as hollow cylinders to receive a continuous ion beam, conduct the ion beam through the hollow cylinders, and accelerate some parts of the ion beam and decelerate other parts in a manner that bunches the ion beam into discrete packets, shown as bunch 109A, to be received and further accelerated by an acceleration stage 158, located downstream. The drift tube assembly 150 may be constructed of graphite or similar suitable material configured to minimize contamination of an ion beam conducted therethrough. The subsequent accelerating stages, indicated by acceleration stage 158, may operate at a well-defined frequency $\omega$, and the capture of the bunches into this accelerating structure may be limited to approximately ±5° of phase angle with respect to this fundamental angular frequency $\omega$. In order to transmit the largest possible current through the entire beamline, arranging the buncher 130 to produce one bunch for each cycle of this fundamental frequency $\omega$ is desirable.

As shown in FIG. 2, the buncher 130 further includes an AC voltage assembly 140, arranged to send to the AC drift tube assembly 156, an AC voltage signal to drive a changing voltage at a powered drift tube of the AC drift tube assembly 156. The varying voltage on the AC drift tube assembly 156 assembly provides different acceleration to the ions, depending on the arrival time of the ions at the AC drift tube assembly 156. In this way, the trailing end 109A1 of the bunch 109A is given more velocity than the leading end 109A2 of the bunch 109A, and the whole of the bunch 109A becomes as compact as possible when arriving at the acceleration stage 158. In various embodiments, the AC voltage signal may be a composite of a plurality of individual AC voltage signals, superimposed to generate an AC voltage signal in a manner to provide improved bunching of a continuous ion beam. In various embodiments, the AC voltage assembly 140 may generate a first AC voltage signal at a first frequency, and a second AC voltage signal at a second frequency, where the second frequency comprises an integral multiple of the first frequency. In some embodiments, the AC voltage assembly 140 may generate a third AC voltage signal at a third frequency, where the third frequency constitutes an integral multiple of the first frequency, different from the second frequency, and so forth. Thus, the second frequency, third frequency, etc., may be harmonics of the first frequency, where the frequency may be double, triple, etc., in comparison to the first frequency.

In the embodiment of FIG. 2, the AC voltage assembly 140 is shown to generate three different AC voltage signals, represented by $V_1 \cos(\omega t+\phi_1)$, $V_2 \cos(2\omega t+\phi_2)$, and $V_3 \cos(3\omega t+\phi_3)$. For purposes of illustration, the AC voltage signals are shown as sinusoidal signals, while other waveform shapes are possible. The AC voltage assembly 140 may include a first AC voltage supply 142, second AC voltage supply 144, and third AC voltage supply 146, to generate a first AC voltage signal, second AC voltage signal, and third AC voltage signal, respectively. An AC voltage supply may be embodied using an RF amplifier driven by a synchronized signal generator. The general term V refers to the maximum amplitude of the AC voltage signal while the general term $\phi$ refers to the phase of the AC voltage signal. Thus, the maximum amplitude and the phase may differ among the different signals. In this embodiment, the second and third AC voltage signals represent a doubling and a tripling, respectively, of the frequency of the first signal w. As shown in FIG. 2, the AC voltage assembly 140 may include an adder 148, where the adder 148 sums the individual voltage signals and outputs a composite AC voltage signal 149 to the AC drift tube assembly 156.

In various embodiments, the composite AC voltage signal may be formed from AC voltage signals where the highest frequency of an AC voltage signal is approximately 120 MHz or less.

The composite AC voltage signal 149 is designed to adjust the phase dependence of ions processed by the AC drift tube assembly 156 in a manner that increases the acceptance at a downstream acceleration stage. In known linear accelerators of ion implantation systems, when a continuous ion beam is bunched for transmitting in packets to downstream acceleration stages, a certain fraction of the ion beam is lost to the walls or other surfaces due to the nature of the acceleration and bunching process. The acceptance refers to the percentage of ion beam (such as a percentage of beam current) not lost, and therefore accepted by the downstream acceleration stage. As noted, in known ion implantation apparatus employing linear accelerators, the acceptance may be on the order of 30% to 35% at a maximum, when various conditions are optimized. Such known ion implantation systems may drive a buncher with an AC voltage signal having a frequency of 10 MHz, 13.56 MHz, or 20 MHz, with a voltage amplitude in the range of tens of kV. Notably, the AC voltage signal in known ion implantation systems may be generated as a single frequency, simple AC voltage signal.

Notably, the fundamental component of the composite AC voltage signal may be simplified to $V_1 \cos(\omega t)$, where the relative phase with respect to the other two AC voltage signals is given by the respective phase offsets, $\phi_2$ or $\phi_3$. As detailed below, these offsets may be adjusted to increase acceptance.

In particular, the present inventor has found that the application of multiple frequencies to generate a complex (composite waveform) generates better output phase coherence/capture, as compared to known bunchers that employ an AC voltage signal at a single frequency.

Figure 3:
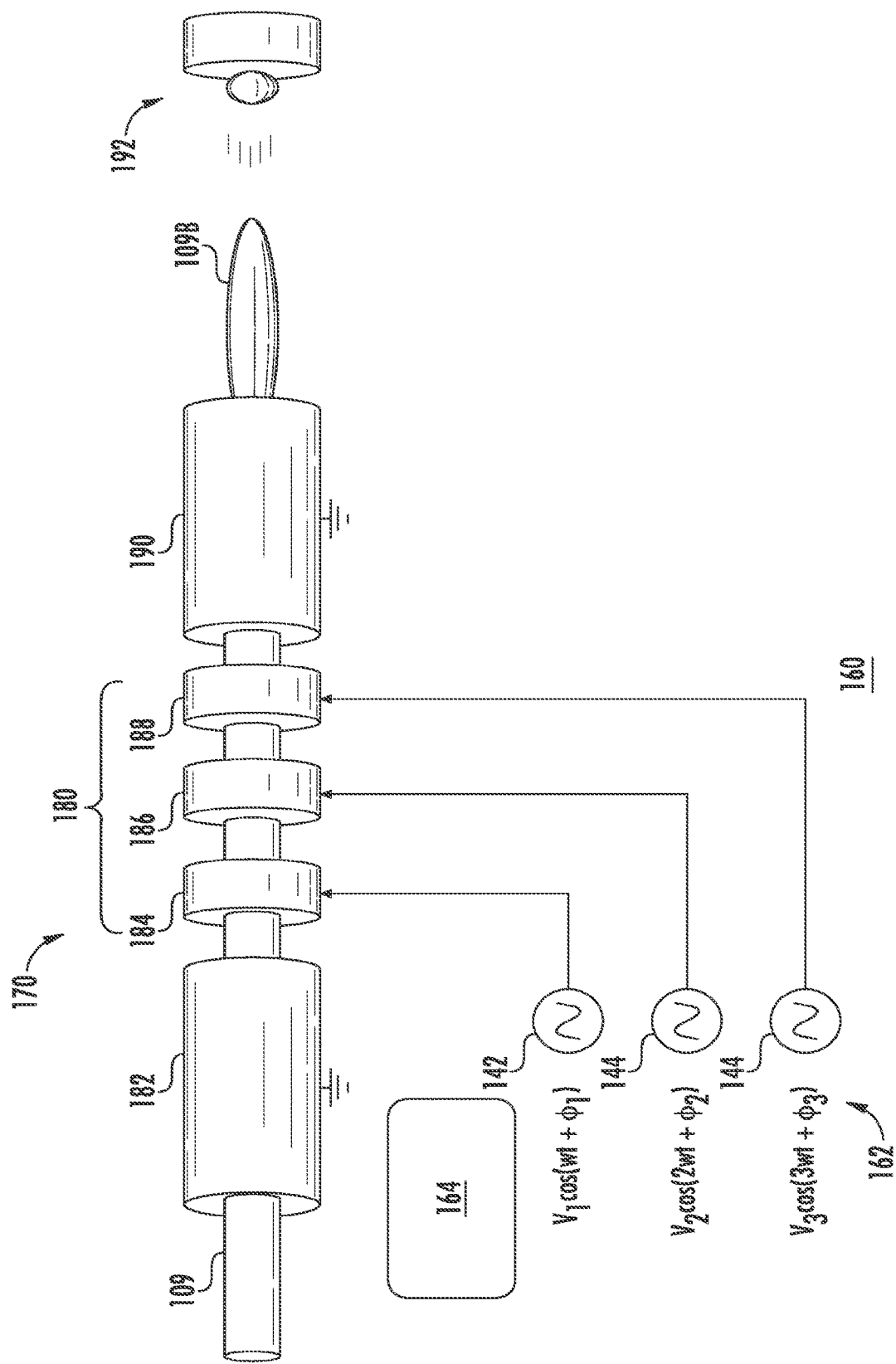
FIG. 3 shows another exemplary buncher, according to other embodiments of the disclosure.

Turning to FIG. 3 there is shown the structure of an exemplary buncher of a linear accelerator, buncher 160, according to further embodiments of the disclosure. The buncher 160 may include a drift tube assembly 170, including a first grounded drift tube 182, arranged to accept a continuous ion beam, shown as accelerated ion beam 109. As shown, the first grounded drift tube 182 is connected to electrical ground. The drift tube assembly 170 may further include an AC drift tube assembly 180, arranged downstream to the first grounded drift tube 182. As discussed in detail below, the AC drift tube assembly 180, similarly to AC drift tube assembly 156, is arranged to receive an AC voltage signal(s), generally in the radio frequency range (RF range), which signal functions to accelerate and manipulate the accelerated ion beam 109. In the embodiment of FIG. 3, the AC drift tube assembly 180 includes three AC drift tubes, shown as AC drift tube 184, AC drift tube 186, and AC drift tube 188.

The drift tube assembly 170 further includes a second grounded drift tube 190, downstream to the AC drift tube assembly 180. As a whole, the drift tube assembly 170 is arranged as hollow cylinders to receive a continuous ion beam, conduct the ion beam through the hollow cylinders, and accelerate the ion beam in a manner that bunches the ion beam into discrete packets, shown as bunch 109A, to be received and further accelerated by an acceleration stage 192, located downstream. As such the drift tube assembly 170 may constitute a multi-ring drift tube assembly having a length (along the direction of propagation of the ion beam) of at least 100 mm and less than 400 mm.

In the embodiment of FIG. 3, an AC voltage assembly 162 is provided, and arranged to send to the AC drift tube assembly 180, an AC voltage signal to drive a changing voltage at a powered drift tube of the AC drift tube assembly 180. The AC voltage assembly 162 may be configured wherein first AC voltage supply 142 drives the AC drift tube 184, the second AC voltage supply 144 drives the AC drift tube 186, and the third AC voltage supply 146 drives AC drift tube 188. These AC voltage signals may be synchronized in time by controller 164 to effectively generate a composite signal similar to composite AC voltage signal 149. While FIG. 3 illustrates a configuration where the lowest frequency AC voltage signal is supplied to the furthest upstream AC drift tube, in other embodiments, the lowest frequency AC voltage signal ($V_1 \cos(\omega t+\phi_1)$) may be applied to a different AC drift tube. The same applies to the intermediate frequency AC voltage signal ($V_2 \cos(2\omega t+\phi_2)$), and the high frequency AC voltage signal ($V_3 \cos(3\omega t+\phi_3)$). This configuration has the advantage over the configuration in FIG. 2 where the risk of a power supply interfering with other power supplies is avoided.

While the use of a multiple-frequency AC voltage signal to drive a buncher is possible, notably, using multiple frequencies to generate an AC voltage signal may entail more voltage supplies, and may lead to longer beamline, as detailed below. Accordingly, such a configuration in a beamline ion implanter has not heretofore been conceived. Notably, the present inventor has identified configurations where these considerations may be overcome by adjusting drive signals to markedly improve ion beam throughput, especially for ions having a mass in the range of common dopants such as boron, phosphorous, and the like. In particular, in the "single-ring" (where "ring" refers to an AC drift tube) buncher of FIG. 2 or the "triple-ring" buncher of FIG. 3, a composite AC voltage signal is produced, where the bunching of the ion beam is performed in a manner to improve phase coherence by using of an ion beam at a targeted distance from the AC drift tube assembly, and accordingly to increase the acceptance.

Figure 4:
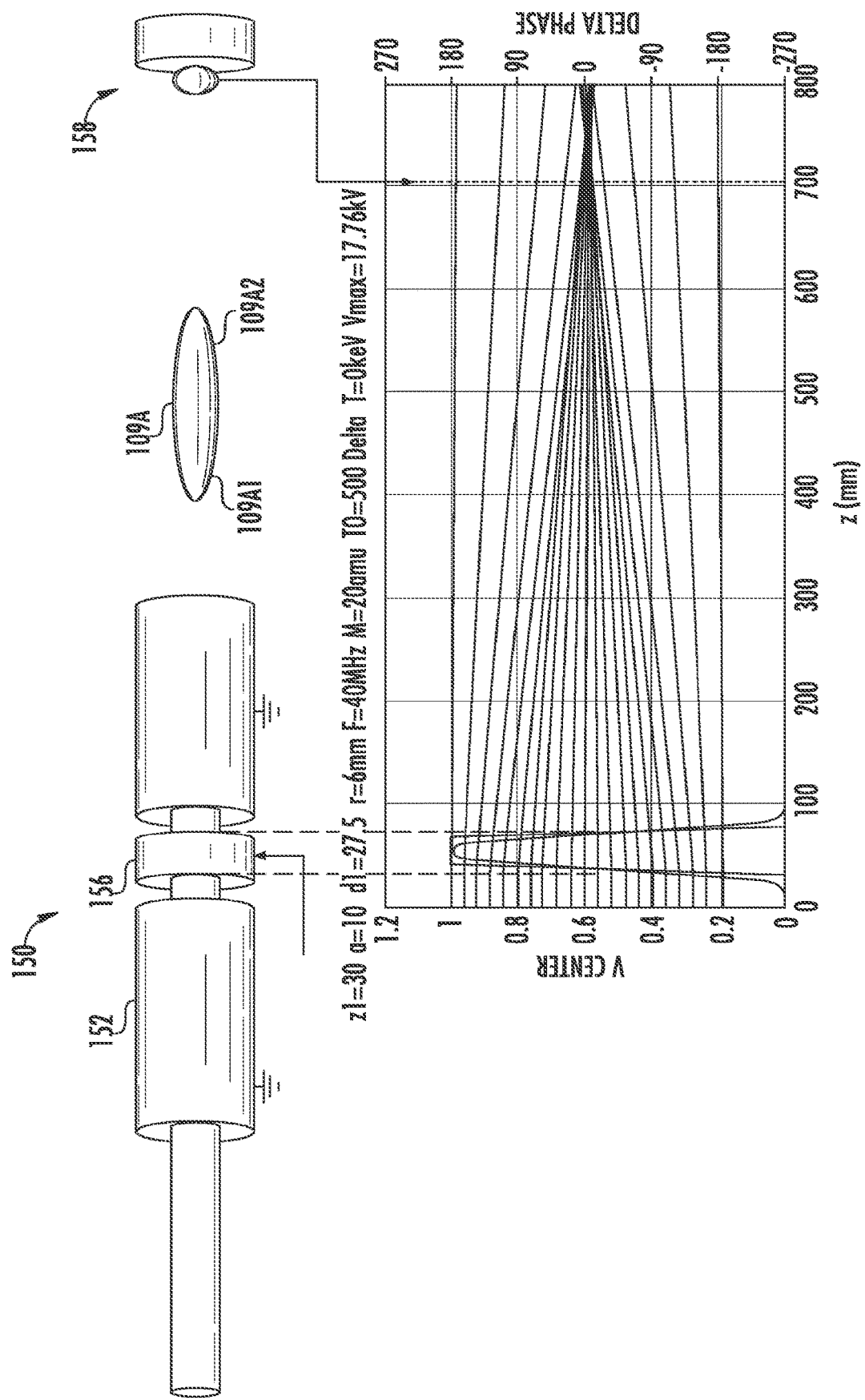
FIG. 4 depicts results of modeling of operation of a drift tube assembly, according to embodiments of the disclosure.

Turning to FIG. 4, there is shown a composite illustration including a depiction of the drift tube assembly 150, and a corresponding phase map, shown as a function of distance in millimeters along the beam path. The phase map is a graph illustrating the phase (shown on the right-hand ordinate) as a function of distance, with the position of the lone drift tube of the AC drift tube assembly 156, extending between 30 mm and 75 mm. At this location, the voltage (shown by left hand ordinate) applied to the AC drift tube assembly 156 reaches a maximum of approximately 18 kV, and is applied at a frequency of 40 MHz. The relative phase position of a series of 21 different rays of the accelerated ion beam 109 is shown to the right of the graph. The mass of the ions of the accelerated ion beam 109 is assumed to be 20 amu. As shown, the voltage reaches a maximum at the position of AC drift tube assembly 156, and is zero elsewhere. At the point of entry into the AC drift tube assembly 156 the 21 exemplary rays are equally spaced in phase at intervals of 18 degrees. When treated by the composite AC voltage signal given by $V=V_1 \cos(\omega t+\phi_1)+V_2 \cos(2\omega t+\phi_2)+V_3 \cos(3\omega t+\phi_3)$, such as generated by AC voltage assembly 140, the various rays converge in phase to the right, as shown.

At a location corresponding to 700 mm, 670 mm to the right of the entrance to the AC drift tube assembly 156, the phase difference between many of the rays is close to zero. Thus, when the entrance to an acceleration stage 158 is positioned at the 700 mm location, corresponding to a zero-phase difference between many of the rays, the acceptance may be a maximum. For an acceptance based upon +/−5-degree variation, in the example of FIG. 4, the acceptance at the accelerator is approximately 55%. In various other simulations, the maximum acceptance for the configuration of FIG. 4 has been calculated to be as high as 75%, a substantial improvement over the acceptance of 30%-35% in known ion implanters employing single frequency bunchers. For example, when V is set to equal 59.4 kV, the acceptance is 75%, while at 24 kV, the acceptance is 65%.

Notably, the same behavior for phase convergence shown in FIG. 4 using the illustration of the AC drift tube assembly 156, may be obtained by applying the same voltage parameters to the triple ring configuration of the AC drift tube assembly 180.

Figure 5A:
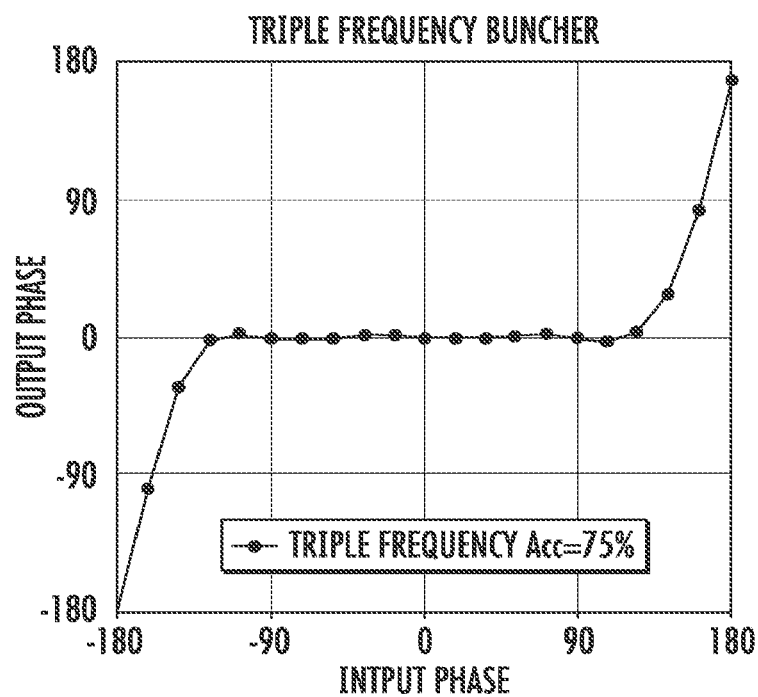
FIG. 5A and FIG. 5B are graphs illustrating the phase behavior of different rays of ion beams treated by different bunchers, highlighting benefits of the present embodiments.
Figure 5B:
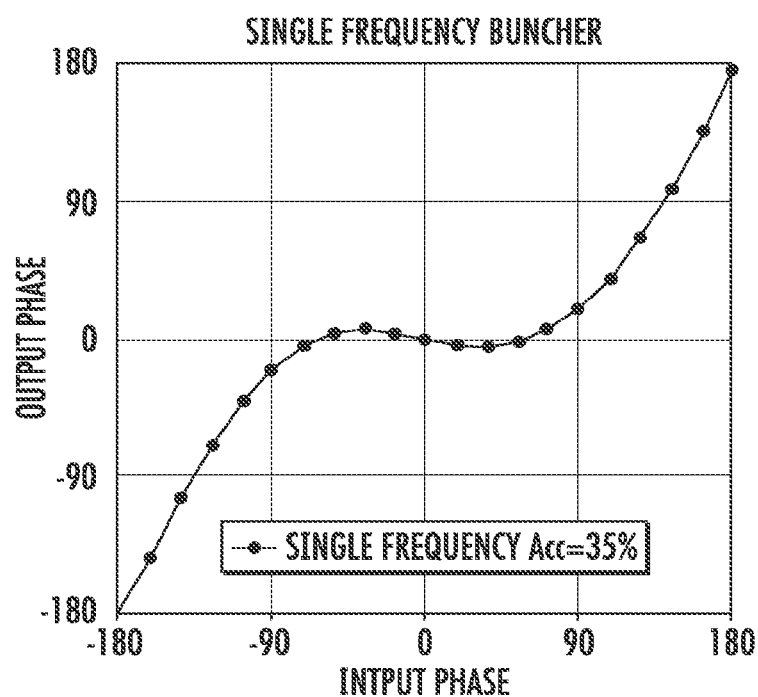

FIG. 5A and FIG. 5B are graphs illustrating the phase behavior of different rays of ion beams, highlighting the benefit of applying a composite AC voltage signal in accordance with the present embodiments. FIG. 5A continues with the composite AC voltage parameters of the embodiment of FIG. 4, while FIG. 5B illustrates an example of applying a simple AC voltage signal to the ion beam. In the illustration of FIG. 5B, the AC signal is given by $V=V_{max} \cos(\omega t+\phi)$, while in FIG. 5A the AC signal is given by $V=V_1 \cos(\omega t+\phi_1)+V_2 \cos(2\omega t+\phi_2)+V_3 \cos(3\omega t+\phi_3)$. The frequency $\omega$ is 40 MHz in both cases.

In the two different graphs, the phase behavior depicts the phase of given rays at a designated distance from a point near the entrance to the buncher as a function of the phase of the given rays at the entrance to the buncher. The designated distance is set at a distance where the phase of the different rays of the ion beam may be conveniently converged. Thus, with reference again to FIG. 4, in a bunch 109A, operation of the AC drift tube assembly 156 tends to accelerate the phase-lagging ions, trailing end 109A1, and tends to decelerate the phase-leading ions, leading end 109A2, leading to a phase convergence, such as at 700 mm.

In FIG. 5B, the most phase coherent condition, generating the highest relative acceptance of 35%, there is a small degree of phase difference at 400 mm even for differences in initial phase as small as 30 degrees. For other voltages the behavior is worse, as shown. Notably, the embodiment of FIG. 5A produces a convergence at 700 mm, somewhat longer than the single frequency buncher results, requiring a convergence at 400 mm. This result is in part due to the need to maintain AC voltage amplitude at a reasonable level for the composite AC voltage signal, such as approximately 20 kV. In the case of the single frequency buncher, operation at 20 kV AC voltage amplitude allows convergence at 400 mm. While the embodiment of FIG. 5A may entail a somewhat longer separation between the buncher and accelerator in comparison to the single frequency buncher architecture (700 mm vs 400 mm), a benefit is the substantially larger acceptance, and thus beam current, conducted into the main accelerator stages of a LINAC. In various additional embodiments, the convergence length may range from 300 mm to 1000 mm.

Without limitation as to a particular theory, the above results may be interpreted in the following manner. The application of multiple frequencies to generate a complex or composite AC voltage signal (waveform) may generate a waveform having a shape that is more conducive to increasing capture. In principle a waveform having a sharp characteristic such as a vertical sawtooth shape, as shown in FIG. 10. This waveform may accelerate ions in a manner where one "tooth" causes the ions to come together to make one bunch, in theory enabling ~100% capture. Notably, in practical bunchers, a resonator based upon a resonance circuit is used to drive the AC voltage waveform at relevant frequencies (in the MegaHertz range), where the resonance circuit inherently generates a sinusoidal waveform, which waveform does not generate high capture as in the vertical sawtooth case. In the present approach, the addition of sinusoidal waveforms at multiple different frequencies is used to generate a composite waveform that may exhibit a shape closer to the ideal sawtooth shape, and accordingly increase the improved output phase coherence and capture, as described above.

Note that in the present embodiments, two or more waveforms may exhibit the relationship where a first waveform is generated at a fundamental frequency and the other waveform(s) are generated at an integral multiple of the fundamental frequency. In this manner, when a new component is at an integral multiple of a fundamental frequency, each ion bunch will experiences the same fields, and the fundamental highest common factor frequency remains at the fundamental frequency.

While in principle the addition of a large number of waveforms (such as a Fourier series) may generate a synthesized composite waveform that more accurately approximates a sawtooth waveform, such an approach may be impractical due to the increased cost of adding such a large number of frequencies. The present inventor has discovered that the addition of just two or three harmonics of sinusoidal waveforms generates a very substantial increase in output phase coherence and capture, as discussed above. Moreover, the present inventor has discovered that application of different sinusoidal waveforms to separate electrodes may work similarly to applying the different sinusoidal waveforms to a single electrode, and that the application of just two waveforms generates a significant improvement in output phase coherence and capture, similar to the case of three waveforms, as opposed to the relatively lower output phase coherence generated by a single frequency waveform.

While additional stages of a LINAC may perform in a similar manner to the bunchers of the present embodiments, to accelerate and further bunch a packet of ions, these additional stages of the LINAC need not be driven by composite AC voltage signals as shown. In other words, because the composite AC voltage signal of the buncher has already mostly converged the phase of the various rays of the bunched ion beam at the entrance to an accelerator stage, further improvement of phase convergence may be less needed. This fact allows simpler design of AC voltage assemblies to drive the accelerator stages of the LINAC.

As an example, in one embodiment of a triple-frequency composite AC signal, the fundamental frequency for a first signal may be 40 MHz, while the first harmonic frequency may be 80 MHz for a second signal, added to the first signal, and a second harmonic frequency may be 120 MHz for a third signal, added to the first signal and the second signal.

Notably, while the above embodiments emphasize generating composite AC voltage signals based upon three AC voltage signals, and employing a multi-ring drift tube assembly including three drift tubes, in other embodiments, a composite AC voltage signal may be formed from two AC voltage signals, or four AC voltage signals. The embodiments are not limited in this context. Likewise, a multi-ring drift tube assembly according to other embodiments may employ two drift tubes or four drift tubes. The embodiments are not limited in this context.

Figure 6:
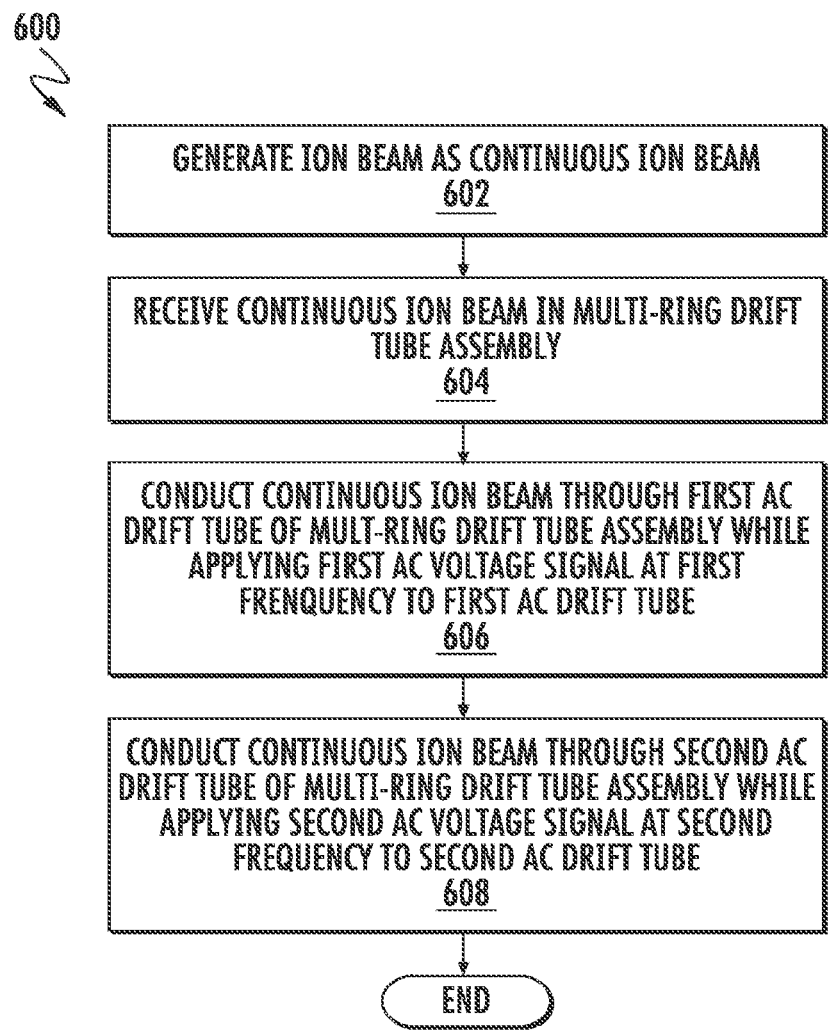
FIG. 6 depicts an exemplary process flow according to some embodiments of the disclosure.

FIG. 6 depicts an exemplary process flow 600 according to some embodiments of the disclosure. At block 602 an ion beam is generated as a continuous ion beam, such as by extraction from an ion source. As such, the ion beam may exhibit an ion energy in the range of several keV up to approximately 80 keV. Optionally, the continuous ion beam may be accelerated to generate an accelerated continuous ion beam. In one example, a DC accelerator column may be applied to accelerate the continuous ion beam. As such, the accelerated continuous ion beam may exhibit an ion energy of 200 keV to 500 keV or greater in some embodiments.

At block 604, the continuous ion beam is received in a multi-ring drift tube assembly. The multi-ring drift tube assembly may include a first grounded drift tube and a second grounded drift tube, as well as a multi-ring AC drift tube assembly, disposed between the first grounded drift tube and the second grounded drift tube.

At block 606, the continuous ion beam is conducted through a first AC drift tube of the multi-ring drift tube assembly while a first AC voltage signal is applied at a first frequency to the first AC drift tube.

At block 608, the continuous ion beam is conducted through a second AC drift tube of the multi-ring drift tube assembly while a second AC voltage signal is applied at a second frequency to the second AC drift tube. In various embodiments, the second frequency may be an integral multiple of the first frequency, such as double the first frequency. In an optional operation, the accelerated continuous ion beam may be conducted through a third AC drift tube of the multi-ring drift tube assembly while a third AC voltage signal is applied at a third frequency to the third AC drift tube. The third frequency may be an integral multiple of the first frequency, different from the second frequency. As such, the accelerated continuous ion beam may be output from the multi-ring drift tube assembly as a bunched ion beam.

Figure 7:
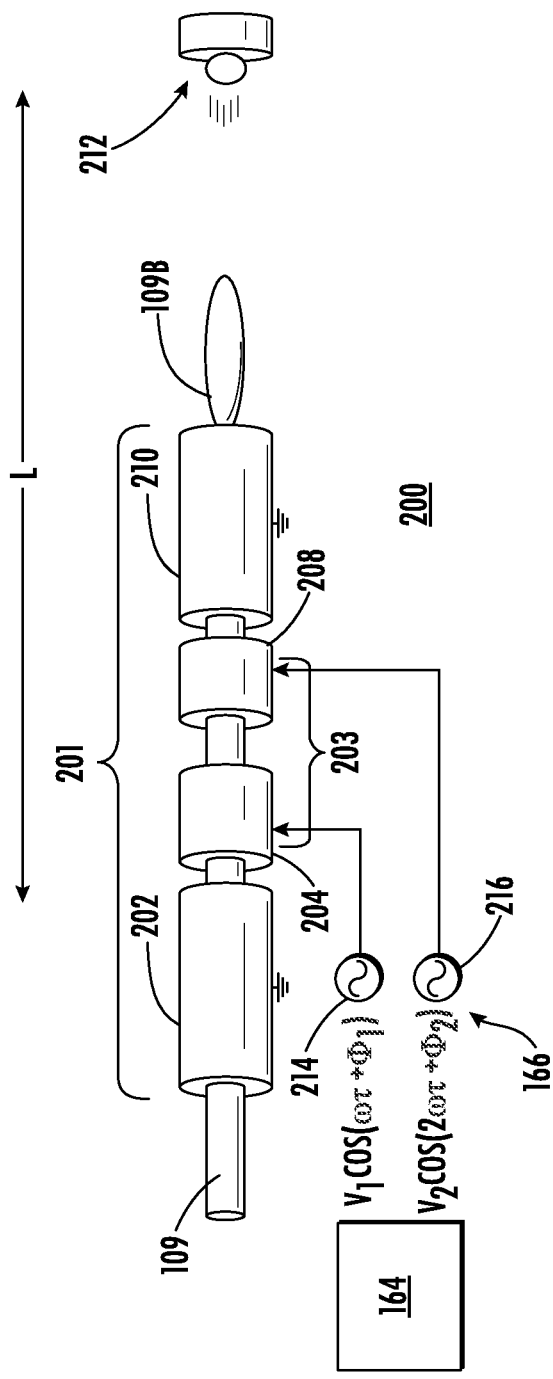
FIG. 7 shows another exemplary buncher, according to other embodiments of the disclosure.

FIG. 7 shows another exemplary buncher, for a linear accelerator, buncher 200, according to further embodiments of the disclosure. The buncher 200 may include a drift tube assembly 201, including a first grounded drift tube 202, arranged to accept a continuous ion beam, shown as accelerated ion beam 109. As shown, the first grounded drift tube 202 is connected to electrical ground. The drift tube assembly 201 may further include an AC drift tube assembly 203, arranged downstream to the first grounded drift tube 182. The AC drift tube assembly 203, similarly to aforementioned AC drift tube assemblies, is arranged to receive an AC voltage signal(s), generally in the radio frequency range (RF range), which signal functions to accelerate/decelerate and manipulate the accelerated ion beam 109. In the embodiment of FIG. 7, the drift tube assembly 201 includes two AC drift tubes, shown as AC drift tube 204, and AC drift tube 208.

The drift tube assembly 201 further includes a second grounded drift tube 210, downstream to the AC drift tube assembly 203. As a whole, the drift tube assembly 201 is arranged as hollow cylinders to receive a continuous ion beam, conduct the ion beam through the hollow cylinders, and accelerate/decelerate the ion beam in a manner that bunches the ion beam into discrete packets, shown as packet 109B, to be received and further accelerated by a linear accelerator 212, located downstream. As such, the drift tube assembly 201 may constitute a multi-ring drift tube assembly having a length (along the direction of propagation of the ion beam) of at least 100 mm and less than 400 mm.

In the embodiment of FIG. 7, an AC voltage assembly 166 is provided, and arranged to send to the AC drift tube assembly 203, an AC voltage signal to drive a changing voltage at a powered drift tube of the AC drift tube assembly 203. The AC voltage assembly 166 may be configured wherein first AC voltage supply 214 drives the AC drift tube 204, while the second AC voltage supply 216 drives the AC drift tube 208. In this configuration and in the configuration of FIG. 8, the two different AC voltage supplies may output a first frequency of 40 MHz and a second frequency of 80 MHz or alternatively, the two different AC voltage supplies may output a first frequency of 13.56 MHz and a second frequency of 27.12 MHz according to different non-limiting embodiments.

These AC voltage signals may be synchronized in time by controller 164 to generate similar beam behavior as produced by a single drift tube with a composite signal given by $V = V_1 \cos(\omega t + \phi_1) + V_2 \cos(2\omega t + \phi_2)$. In this manner, the output phase coherence as a function of input phase of ions may be improved over single frequency bunchers in a manner analogous to the embodiments of FIGS. 2-5B, discussed above.

While FIG. 7 illustrates a configuration where the lowest frequency AC voltage signal is supplied to the furthest upstream AC drift tube 204, in other embodiments, the lowest frequency AC voltage signal ($V_1 \cos(\omega t + \phi_1)$) may be applied to a different AC drift tube.

Figure 8:
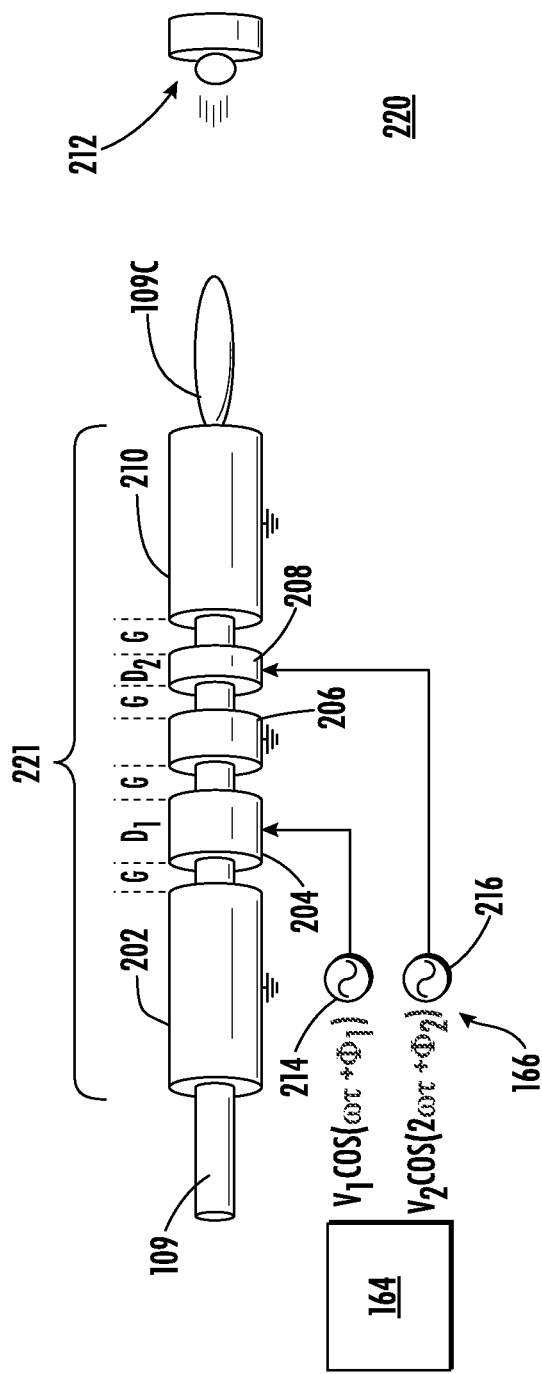
FIG. 8 shows still another exemplary buncher, according to other embodiments of the disclosure.

FIG. 8 shows still another exemplary buncher, buncher 220, according to other embodiments of the disclosure. The buncher 220 may include a drift tube assembly 221, including a first grounded drift tube 202, arranged to accept a continuous ion beam, shown as accelerated ion beam 109. As shown, the first grounded drift tube 202 is connected to electrical ground. The drift tube assembly 221 may further include an AC drift tube 204, arranged downstream to the first grounded drift tube 202. In the embodiment of FIG. 8, an AC drift tube 208 is located downstream of the AC drift tube 204, and a second grounded drift tube 210 is located downstream to the AC drift tube 208, as in the embodiment of FIG. 7. As such, the drift tube assembly 201 may constitute a multi-ring drift tube assembly having a length L (along the direction of propagation of the ion beam) of at least 100 mm and less than 400 mm. In addition to the aforementioned components, the drift tube assembly 221 includes an intermediate grounded drift tube 206, disposed between the AC drift tube 204 and AC drift tube 208. An advantage provided by this configuration is the reduced risk of cross-talk between the two power supplies (AC voltage supply 214, AC voltage supply 216) and two resonant circuits that respectively drive the AC drift tube 204 and AC drift tube 208.

The embodiment of FIG. 8 illustrates a drift tube assembly 221 characterized by an alternating sequence of one AC drift tube alternating with one grounded drift tube, as the ion beam in conducted down a beamline. In other embodiments of alternating sequences, three or more AC drift tubes may be provided to generate a composite AC signal, generally as described with respect to FIG. 3, except with a grounded drift tube disposed between each successive pair of AC drift tubes. In this manner, cross-talk between all power supplies and resonators may be curtailed.

Note that in embodiments using two frequencies up to 200 degrees of output phase coherence may be obtained with up to 55% acceptance of an ion beam. In various embodiments, the tube length of drift tubes may be adjusted with the following considerations: 1) the length may be adjusted according to the distance the ions in a given ion beam travel in 180°, or $$D_0 = \frac{\pi v}{\omega},$$

where v is the velocity. This distance gives the maximum acceleration for a given voltage, but may produce some undesirable phase effects. Using shorter tubes as low as $0.2 D_0$ will require higher voltage but may generate better results overall. As regards the convergence length L, making this parameter shorter is beneficial but requires higher voltage to be applied. Accordingly, L may range from 300 mm to 1 m according to different embodiments based upon ion species, voltage considerations, and other effects.

Note also that while application of multifrequency signals may generally act to increase convergence length when design is limited to a maximum voltage applied and the individual frequencies are subtractive, specific multifrequency designs may be accomplished without increasing convergence length.

FIG. 9 provides an example of such an arrangement, where the buncher 230 is shown. The drift tube assembly 232 includes a first grounded drift tube 234; a first AC drift tube 236, disposed adjacent to the first grounded drift tube 234, and downstream of the first grounded drift tube 234; a first intermediate grounded drift tube 238, arranged downstream of the first AC drift tube 236, a second AC drift tube 240, disposed adjacent to the first intermediate grounded drift tube 238, and downstream of the first intermediate grounded drift tube 238; a second intermediate grounded drift tube 242, disposed adjacent to the second AC drift tube 240, and downstream of the second AC drift tube 240; a third AC drift tube 244, disposed adjacent to the second intermediate grounded drift tube 242, and downstream of the second intermediate grounded drift tube 242; and a second grounded drift tube 246, wherein the second grounded drift tube 246 is disposed adjacent to the third AC drift tube 244, and downstream of the third AC drift tube 244. Again, the provision of the first intermediate grounded drift tube 238 and the second intermediate grounded drift tube 242 may prevent crosstalk between the first AC voltage supply 142, second AC voltage supply 144, and third AC voltage supply 146.

In sum, the present embodiments provide bunchers that are controlled using multi-frequency signals applied either in concert to a lone AC drift tube, or applied separately and individually to dedicated AC drift tubes. While not limiting various embodiments may employ commercially available frequencies as listed in table I below.

TABLE I

| Frequency Range | | Center frequency |
|---|---|---|
| 6.765 MHz | 6.795 MHz | 6.78 MHz |
| 13.553 MHz | 13.567 MHz | 13.56 MHz |
| 26.957 MHz | 27.283 MHz | 27.12 MHz |

TABLE I-continued

| Frequency Range | | Center frequency |
| --- | --- | --- |
| 40.66 MHz | 40.7 MHz | 40.68 MHz |
| 433.05 MHz | 434.79 MHz | 433.92 MHz |
| 902 MHz | 928 MHz | 915 MHz |
| 2.4 GHz | 2.5 GHz | 2.45 GHz |
| 5.725 GHz | 5.875 GHz | 5.8 GHz |
| 24 GHz | 24.25 GHz | 24.125 GHz |
| 61 GHz | 61.5 GHz | 61.25 GHz |
| 122 GHz | 123 GHz | 122.5 GHz |
| 244 GHz | 246 GHz | 245 GHz |

The table I above illustrates various ISM frequencies, as defined by the US FCC, where in the present embodiments, each frequency will be an integral multiple of a fundamental frequency applied to one signal. Thus, in a two frequency embodiment, a combination of 13.56 MHz and 27.12 MHz is suitable, in a three-frequency embodiment, a combination of 13.56 MHz and 27.12 MHz, and 40.68 MHz is suitable, etc.

In view of the foregoing, at least the following advantages are achieved by the embodiments disclosed herein. A first advantage is realized by providing a composite AC voltage signal to drive a buncher, so a substantially larger ion beam current may be transmitted through a LINAC disposed downstream. A further advantage is the ability to drive a given AC signal from a given power supply of a plurality of AC power supplies to a dedicated electrode, avoiding interference between power supplies that may occur when coupled to a common multiple power supplies are coupled to drive multiple AC voltage signals through a common electrode, while still driving larger ion beam current as in the case of a composite AC voltage signal.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An ion implantation system, comprising:
an ion source to generate a continuous ion beam;
a buncher, disposed downstream of the ion source, to receive the continuous ion beam and output a bunched ion beam, wherein the buncher comprises a drift tube assembly, the drift tube assembly comprising an alternating sequence of a set of grounded drift tubes and a set of AC drift tubes, arranged in alternating fashion with one another, the drift tube assembly further comprising:
a first grounded drift tube, arranged to accept a continuous ion beam;
at least two AC drift tubes downstream to the first grounded drift tube;
a second grounded drift tube, downstream to the at least two AC drift tubes;
and an AC voltage assembly, electrically coupled to the at least two AC drift tubes, the AC voltage assembly comprising at least two AC voltage sources, separately coupled to the at least two AC drift tubes; and
a linear accelerator, comprising a plurality of acceleration stages, disposed downstream of the buncher to receive and accelerate the bunched ion beam.

2. The ion implantation system of claim 1, wherein the AC voltage assembly comprises:
a first AC voltage source, coupled to deliver a first AC voltage signal at a first frequency to a first AC drift tube of at least two AC drift tubes; and
a second AC voltage source, coupled to deliver a second AC voltage signal at a second frequency to a second AC drift tube of the at least two AC drift tubes, wherein the second frequency comprises an integral multiple of the first frequency.

3. The ion implantation system of claim 2, wherein the first frequency is 40 MHz and the second frequency is 80 MHz.

4. The ion implantation system of claim 2, wherein the first frequency is 13.56 MHz and the second frequency is 27.12 MHz.

5. The ion implantation system of claim 2, the buncher comprises:
the first grounded drift tube;
the first AC drift tube, disposed adjacent to the first grounded drift tube, and downstream of the first grounded drift tube;
an intermediate grounded drift tube, arranged downstream of the first AC drift tube;
the second AC drift tube, disposed adjacent to the intermediate grounded drift tube, and downstream of the intermediate grounded drift tube; and
the second grounded drift tube, wherein the second grounded drift tube is disposed adjacent to the second AC drift tube, and downstream of the second AC drift tube.

6. The ion implantation system of claim 5, wherein the buncher comprises:
the first grounded drift tube;
the first AC drift tube, wherein the first AC drift tube is disposed adjacent to the first grounded drift tube, and downstream of the first grounded drift tube;
a first intermediate grounded drift tube, arranged downstream of the first AC drift tube and downstream of the first AC drift tube;
the second AC drift tube, wherein the second AC drift tube is disposed adjacent to the first intermediate grounded drift tube, and downstream of the first intermediate grounded drift tube;
a second intermediate grounded drift tube disposed adjacent to the second AC drift tube, and downstream of the second AC drift tube;
a third AC drift tube, disposed adjacent to the second intermediate grounded drift tube, and downstream of the second intermediate grounded drift tube; and
the second grounded drift tube, wherein the second grounded drift tube is disposed adjacent to the third AC drift tube, and downstream of the third AC drift tube.

7. The ion implantation system of claim 6, wherein the AC voltage assembly comprises a third AC voltage source, coupled to deliver a third AC voltage signal at a third frequency to the third AC drift tube, wherein the third frequency comprises an integral multiple of the first frequency, different from the second frequency.

8. The ion implantation system of claim 7, wherein the second frequency is twice the first frequency, wherein the third frequency is three times the first frequency.

9. The ion implantation system of claim 7, wherein the first frequency comprises a frequency of at least 13.56 MHz, and wherein the third frequency comprises a frequency of 120 MHz or less.

10. The ion implantation system of claim 1, further comprising a DC accelerator column, disposed between the ion source and the buncher, and arranged to accelerate the continuous ion beam to an energy of at least 200 keV.

11. An ion implantation system, comprising:
an ion source to generate a continuous ion beam;
a buncher, disposed downstream of the ion source, to receive the continuous ion beam and output a bunched ion beam, wherein the buncher comprises:
　a first grounded drift tube, arranged to accept a continuous ion beam;
　a first AC drift tube, disposed adjacent to the first grounded drift tube, and downstream of the first grounded drift tube;
　an intermediate grounded drift tube, arranged downstream of the first AC drift tube and downstream of the first AC drift tube;
　a second AC drift tube, disposed adjacent to the intermediate grounded drift tube, and downstream of the intermediate grounded drift tube;
　a second grounded drift tube, wherein the second grounded drift tube is disposed adjacent to the second AC drift tube, and downstream of the second AC drift tube; and
an AC voltage assembly, comprising:
　a first AC voltage source, coupled to deliver a first AC voltage signal at a first frequency to the first AC drift tube; and
　a second AC voltage source, coupled to deliver a second AC voltage signal at a second frequency to the second AC drift tube, wherein the second frequency comprises an integral multiple of the first frequency
and
a linear accelerator, disposed downstream of the buncher, to receive and accelerate the bunched ion beam.

12. An ion implantation system, comprising:
an ion source to generate a continuous ion beam;
a buncher, disposed downstream of the ion source, to receive the continuous ion beam and output a bunched ion beam, the buncher comprising:
　a first AC drift tube to receive a first AC signal at a first frequency; and
　a second AC drift tube, disposed downstream of the first AC drift tube, to receive a second AC signal at a second frequency being an integral multiple of the first frequency; and
a linear accelerator, disposed downstream of the buncher, to receive and accelerate the bunched ion beam.

13. The ion implantation system of claim 12, further comprising
a first grounded drift tube, disposed upstream of the first AC drift tube;
an intermediate grounded drift tube, arranged downstream of the first AC drift tube; and
a second grounded drift tube, wherein the second grounded drift tube is disposed adjacent to the second AC drift tube, and downstream of the second AC drift tube.

* * * * *